(12) United States Patent
Cheng et al.

(10) Patent No.: US 9,349,861 B1
(45) Date of Patent: May 24, 2016

(54) SILICON-ON-INSULATOR SUBSTRATES HAVING SELECTIVELY FORMED STRAINED AND RELAXED DEVICE REGIONS

(71) Applicant: International Business Machines Corporation, Armonk, NY (US)

(72) Inventors: Kangguo Cheng, Schenectady, NY (US); Bruce B. Doris, Slingerlands, NY (US); Ali Khakifirooz, Los Altos, CA (US); Devendra K. Sadana, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/744,078

(22) Filed: Jun. 19, 2015

Related U.S. Application Data

(63) Continuation of application No. 14/674,086, filed on Mar. 31, 2015.

(51) Int. Cl.
*H01L 21/02* (2006.01)
*H01L 29/78* (2006.01)
(Continued)

(52) U.S. Cl.
CPC ........ *H01L 29/7847* (2013.01); *H01L 21/0243* (2013.01); *H01L 21/02381* (2013.01); *H01L 21/02532* (2013.01); *H01L 21/02587* (2013.01); *H01L 21/02636* (2013.01); *H01L 21/02664* (2013.01); *H01L 21/2254* (2013.01); *H01L 21/265* (2013.01); *H01L 21/30604* (2013.01);
(Continued)

(58) Field of Classification Search
CPC ............... H01L 21/02532; H01L 21/31116; H01L 21/02664; H01L 21/324; H01L 21/02636; H01L 21/2254
USPC ........................................................ 438/151
See application file for complete search history.

(56) References Cited

U.S. PATENT DOCUMENTS

| | | | |
|---|---|---|---|
| 2004/0075105 A1* | 4/2004 | Leitz ....................... | C30B 25/02 257/190 |
| 2006/0160291 A1* | 7/2006 | Lee .................... | H01L 21/76254 438/199 |

(Continued)

OTHER PUBLICATIONS

Kangguo Cheng, et al.,"Silicon-on-Insulator Substrates Having Selectively Formed Strained and Relaxed Device Regions," U.S. Appl. No. 14/674,086, filed Mar. 31 2015.

(Continued)

*Primary Examiner* — Christine Enad
(74) *Attorney, Agent, or Firm* — Cantor Colburn LLP; Vazken Alexanian

(57) ABSTRACT

A method of forming a semiconductor device substrate includes forming a donor wafer having a surface comprising regions of relaxed silicon and regions of relaxed silicon germanium (SiGe); epitaxially growing a silicon device layer on the surface of the donor wafer, wherein the silicon device layer comprises tensile strained silicon on the regions of relaxed silicon germanium of the donor wafer, and wherein the silicon device layer comprises relaxed silicon on the regions of relaxed silicon of the donor wafer; and transferring the silicon device layer from the donor wafer to a handle wafer comprising a bulk substrate and an insulator layer, so as to form a silicon-on-insulator (SOI) substrate with the silicon device layer maintaining regions of tensile strained silicon and regions of relaxed silicon.

7 Claims, 17 Drawing Sheets

(51) Int. Cl.
*H01L 29/06* (2006.01)
*H01L 21/225* (2006.01)
*H01L 21/311* (2006.01)
*H01L 21/306* (2006.01)
*H01L 21/265* (2006.01)
*H01L 29/165* (2006.01)
*H01L 21/324* (2006.01)
*H01L 29/10* (2006.01)

(52) U.S. Cl.
CPC ........ *H01L 21/31116* (2013.01); *H01L 21/324* (2013.01); *H01L 29/0649* (2013.01); *H01L 29/1054* (2013.01); *H01L 29/165* (2013.01)

(56) References Cited

U.S. PATENT DOCUMENTS

2007/0048975 A1* 3/2007 Chen ................. H01L 21/76254
438/478
2012/0119259 A1* 5/2012 Flachowsky ...... H01L 29/66651
257/190
2015/0021692 A1* 1/2015 Boeuf ............... H01L 21/02667
257/351

OTHER PUBLICATIONS

List of IBM Patents or Patent Applications Treated as related; Date File: Jun. 19, 2015, pp. 1-2.

* cited by examiner

SILICON-ON-INSULATOR SUBSTRATES HAVING SELECTIVELY FORMED STRAINED AND RELAXED DEVICE REGIONS

DOMESTIC PRIORITY

This application is a continuation of U.S. patent application Ser. No. 14/674,086, filed Mar. 31, 2015, the disclosure of which is incorporated by reference herein in its entirety.

BACKGROUND

The present invention relates generally to semiconductor device manufacturing and, more particularly, to forming silicon-on-insulator (SOI) substrates having selected strained and relaxed silicon device regions.

Field effect transistors (FETs) are widely used in the electronics industry for switching, amplification, filtering, and other tasks related to both analog and digital electrical signals. Most common among these are metal-oxide-semiconductor field-effect transistors (MOSFET or MOS), in which a gate structure is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-type and p-type transistors (NFET and PFET) are used to fabricate logic and other circuitry.

The source and drain regions of an FET are typically formed by adding dopants to targeted regions of a semiconductor body on either side of the channel. A gate structure is formed above the channel, which includes a gate dielectric located over the channel and a gate conductor above the gate dielectric. The gate dielectric is an insulator material, which prevents large leakage currents from flowing into the channel when a voltage is applied to the gate conductor, while allowing the applied gate voltage to set up a transverse electric field in the channel region in a controllable manner. Conventional MOS transistors typically include a gate dielectric formed by depositing or by growing silicon dioxide ($SiO_2$) or silicon oxynitride (SiON) over a silicon wafer surface, with doped polysilicon formed over the $SiO_2$ to act as the gate conductor.

The escalating demands for high density and performance associated with ultra large scale integrated (ULSI) circuit devices have required certain design features, such as shrinking gate lengths, high reliability and increased manufacturing throughput. The continued reduction of design features has challenged the limitations of conventional fabrication techniques. One of the more important indicators of potential device performance is the carrier mobility. There is a significant challenge with respect to keeping carrier mobility high in devices of deeply submicron generations.

The gain of an FET, usually defined by the transconductance ($g_m$), is proportional to the mobility ($\mu$) of the majority carrier in the transistor channel. The current carrying capability, and hence the performance of an FET is proportional to the mobility of the majority carrier in the channel. The mobility of holes, which are the majority carriers in a PFET, and the mobility of electrons, which are the majority carriers in an NFET transistor, may be enhanced by applying an appropriate stress to the channel. Existing stress engineering methods greatly enhance circuit performance by increasing device drive current without increasing device size and device capacitance. For example, a tensile stress liner applied to an NFET transistor induces a longitudinal stress in the channel and enhances the electron mobility, while a compressive stress liner applied to a PFET transistor induces a compressive stress in the channel and enhances the hole mobility.

SUMMARY

In one aspect, a method of forming a semiconductor device substrate includes forming a donor wafer having a surface comprising regions of relaxed silicon and regions of relaxed silicon germanium (SiGe); epitaxially growing a silicon device layer on the surface of the donor wafer, wherein the silicon device layer comprises tensile strained silicon on the regions of relaxed silicon germanium of the donor wafer, and wherein the silicon device layer comprises relaxed silicon on the regions of relaxed silicon of the donor wafer; and transferring the silicon device layer from the donor wafer to a handle wafer comprising a bulk substrate and an insulator layer, so as to form a silicon-on-insulator (SOI) substrate with the silicon device layer maintaining regions of tensile strained silicon and regions of relaxed silicon.

In another aspect, a semiconductor device substrate includes a bulk layer; an oxide layer formed on the bulk layer; and a silicon device layer formed on the oxide layer, the silicon device layer comprising first regions of relaxed silicon, and second regions of tensile strained silicon.

In another aspect, a semiconductor device donor wafer includes a donor substrate; and a silicon device layer formed on a top surface of the donor substrate, the silicon device layer comprising first regions of relaxed silicon, and second regions of tensile strained silicon.

BRIEF DESCRIPTION OF THE DRAWINGS

Referring to the exemplary drawings wherein like elements are numbered alike in the several Figures:

FIGS. 1(a) through 10 are a series of cross sectional views of an exemplary embodiment of a method of forming SOI substrates having selected stressed and relaxed device regions, in accordance with an exemplary embodiment, in which:

FIG. 1(a) illustrates a donor wafer having a graded SiGe buffer layer and a relaxed SiGe layer grown on a silicon layer;

FIG. 2 illustrates the selective removal of portions of the graded SiGe buffer layer and relaxed SiGe layer from the silicon layer;

FIG. 3 illustrates the growth of relaxed silicon in regions where the graded and relaxed SiGe was removed;

FIG. 4 illustrates the removal of the hardmask layer used to pattern the graded and relaxed SiGe layer;

FIG. 5 illustrates the growth of a silicon device layer on the donor wafer, such that the silicon is tensile strained on portions of the donor wafer corresponding to relaxed SiGe and relaxed on portions of the donor wafer corresponding to silicon;

FIG. 6 illustrates the implantation of a hydrogen species into the SiGe/Si portion of the donor wafer in accordance with a smart cut process;

FIG. 7 illustrates a handle wafer to be bonded to the donor wafer;

FIG. 8 illustrates the bonding of the handle wafer to the donor wafer at an oxide-to-oxide bonding interface;

FIG. 9 illustrates cleaving of the donor wafer at the location of the hydrogen implant region;

FIG. 10 illustrates removal of the remaining portions of the donor wafer, leaving the transferred silicon device layer, with selected tensile strained and relaxed regions, bonded to the handle wafer;

FIGS. 11 through 16 are a series of cross sectional views of a method of forming SOI substrates having selected strained and relaxed device regions, in accordance with another exemplary embodiment, in which:

FIG. 11 illustrates a donor SOI substrate;

FIG. 12 illustrates the growth of compressively strained SiGe on selected portions of the silicon layer of the donor SOI substrate;

FIG. 13 illustrates a thermal mixing or condensation process that results in relaxed SiGe regions within the selected portions of the silicon layer;

FIG. 14 illustrates the removal of the hardmask layer used to define the selective SiGe growth, leaving regions of relaxed SiGe within the silicon layer;

FIG. 15 illustrates the growth of a silicon device layer on the donor wafer, such that the silicon is tensile strained on portions of the donor wafer corresponding to relaxed SiGe and relaxed on portions of the donor wafer corresponding to silicon; and FIG. 16 illustrates the transfer of the silicon device layer from the donor wafer to the handle wafer.

DETAILED DESCRIPTION

As transistor device pitch is scaled, conventional strain engineering techniques such as embedded stressors and stress liners (discussed above) lose their effectiveness. Strained substrates, such strained Si on insulator (SSOI) and strained SiGe on insulator are also promising methods as the strain is built into the channel and is thus independent of the device pitch. On the one hand, while use of a strained SOI device layer to improve NFET performance has been demonstrated, the same tensile strained silicon actually degrades PFET performance. Ideally, then, it would be desirable to be able to provide a single semiconductor device layer that provides (for example) tensile strained silicon in first regions where NFET devices are to be formed, and that also provides relaxed silicon (that can be converted later into compressively strained SiGe) in second regions where PFET devices are to be formed.

Accordingly, disclosed herein is a method of method of forming SOI substrates having selected stressed and relaxed device regions. During SOI wafer fabrication, a patterned template (donor) wafer having regions of both relaxed Si and relaxed SiGe is used to transfer regions of relaxed Si and strained Si onto a handle wafer. Even in an advanced node, the minimum width of the relaxed and strained regions in the logic area is roughly equal to the height of the standard cells. For example, with a metal pitch of 45 nm and 9 track design the width of strained Si and relaxed Si regions is around 400 nm, well within the current lithography capabilities.

Figure 1A:
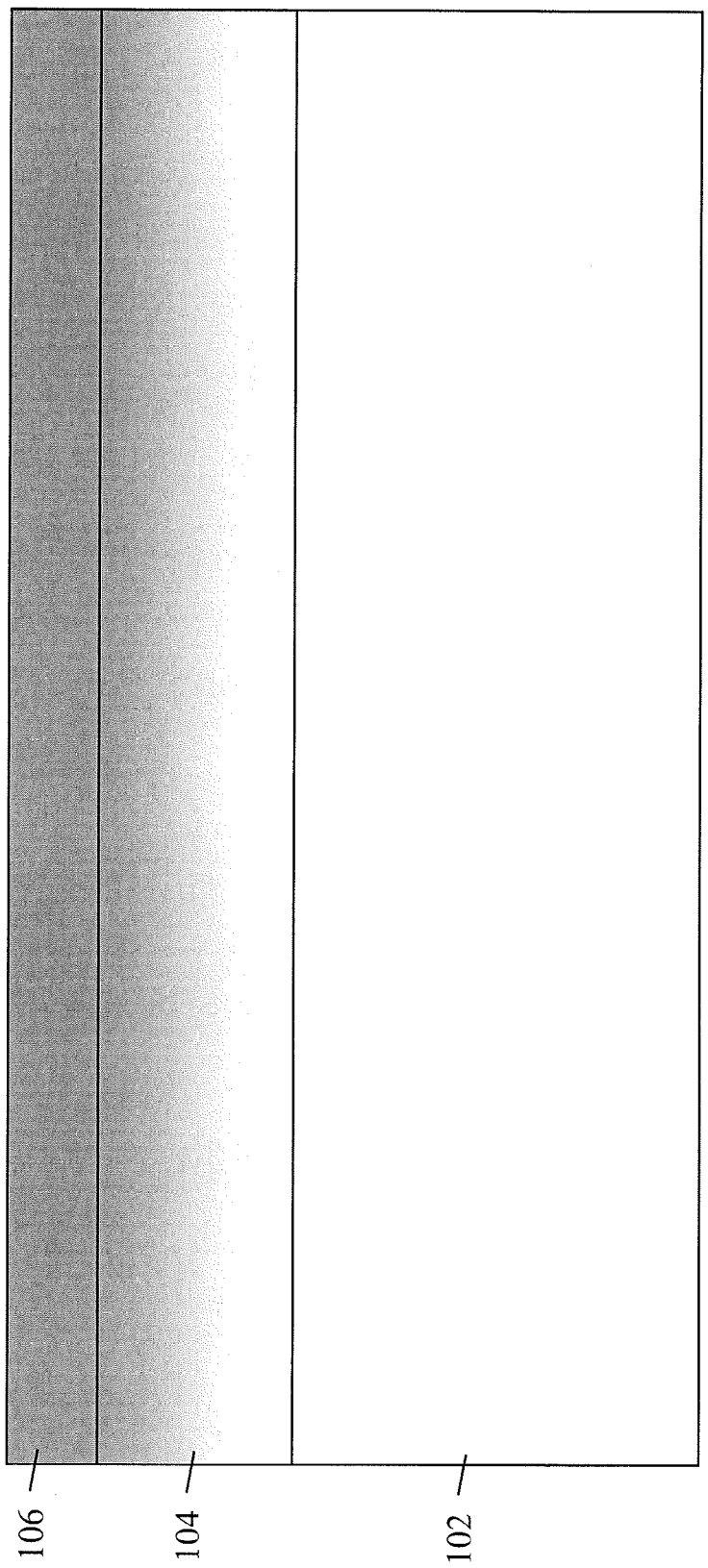
Figure 1B:
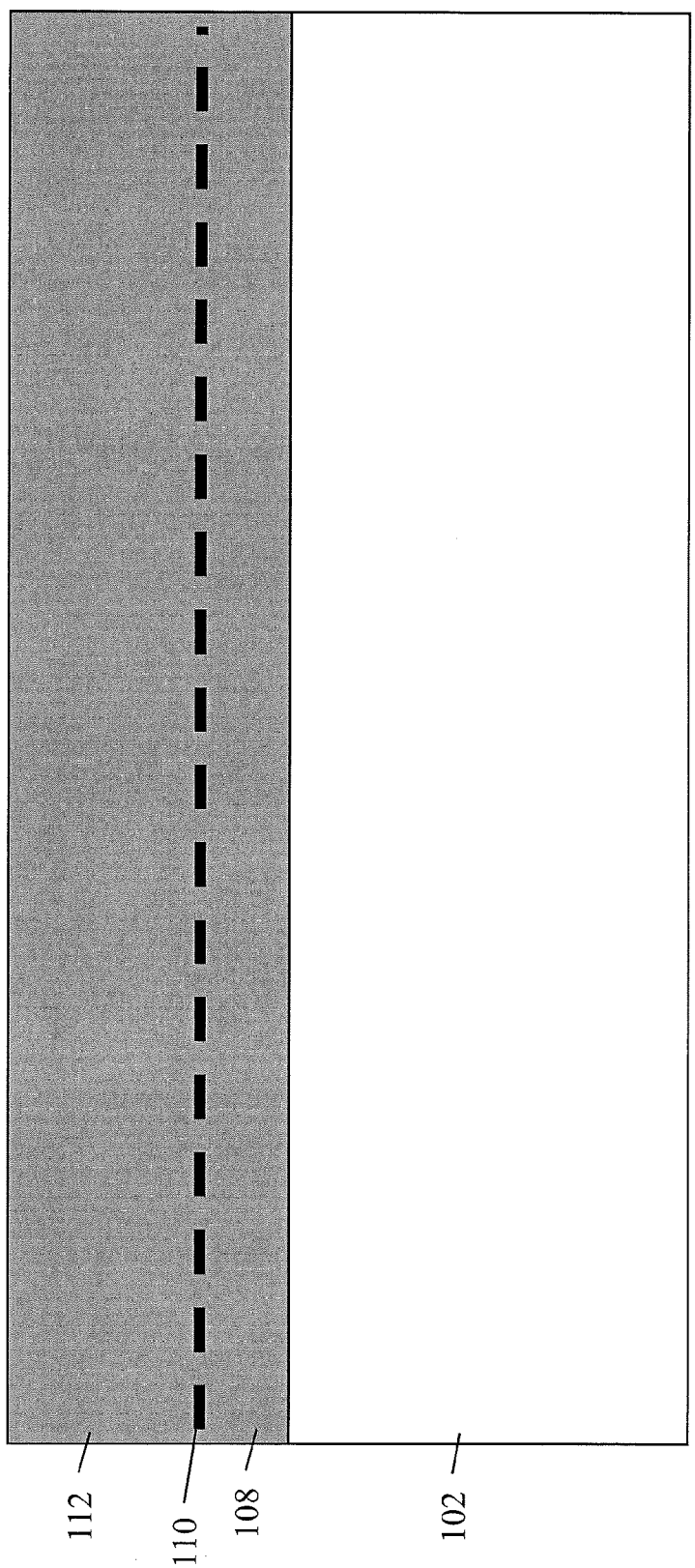
FIG. 1(b) illustrates an alternative embodiment of the donor wafer of FIG. 1(a), in which a thinner, compressively strained SiGe layer is initially grown on a silicon layer, and thereafter relaxed by a subsequent defect implantation.

Referring generally now to FIGS. 1(*a*) through 10, there is shown a series of cross sectional views of a method of forming SOI substrates having selected stressed and relaxed device regions, in accordance with an exemplary embodiment. As particularly shown in FIG. 1(*a*), a donor wafer includes a silicon layer 102 having a graded SiGe buffer layer 104 and a relaxed SiGe layer 106 epitaxially grown thereon. As a result of the epitaxial growth process, the lower portions of the graded SiGe buffer layer 104 will be initially compressively strained as a result of the lattice matching of Ge atoms to Si atoms in the silicon layer 102. Above a certain critical thickness, defects within the crystal structure of the epitaxially grown SiGe material transition and cause a relaxing of the layer. As a result, SiGe layer 106 is relaxed.

In order to produce a relaxed SiGe layer 106 in this manner, the epitaxial growth process continues until the critical thickness of grown SiGe is achieved, which may be on the order of about 1-4 microns (μm). Alternatively, to increase throughput (i.e., reduce the time taken to form a relaxed SiGe layer on a silicon substrate), FIG. 1(*b*) illustrates an alternative embodiment of the donor wafer of FIG. 1(*a*). Here, a thinner (e.g., 200-600 nanometers (nm)), compressively strained SiGe layer 108 is initially grown on the silicon layer 102. Then, a defect layer 110 (e.g., H or He) is implanted in the SiGe layer which relaxes an upper portion 112 of the SiGe layer 108 above the defect layer 110. Regardless of the approach used in either FIG. 1(*a*) or FIG. 1(*b*), the initial structure of the donor wafer is a relaxed SiGe layer formed on a Si layer. Although subsequent figures in this illustrated embodiment refer to the approach in FIG. 1(*a*), it will be appreciated that the approach in FIG. 1(*b*) could also be used.

Figure 2:
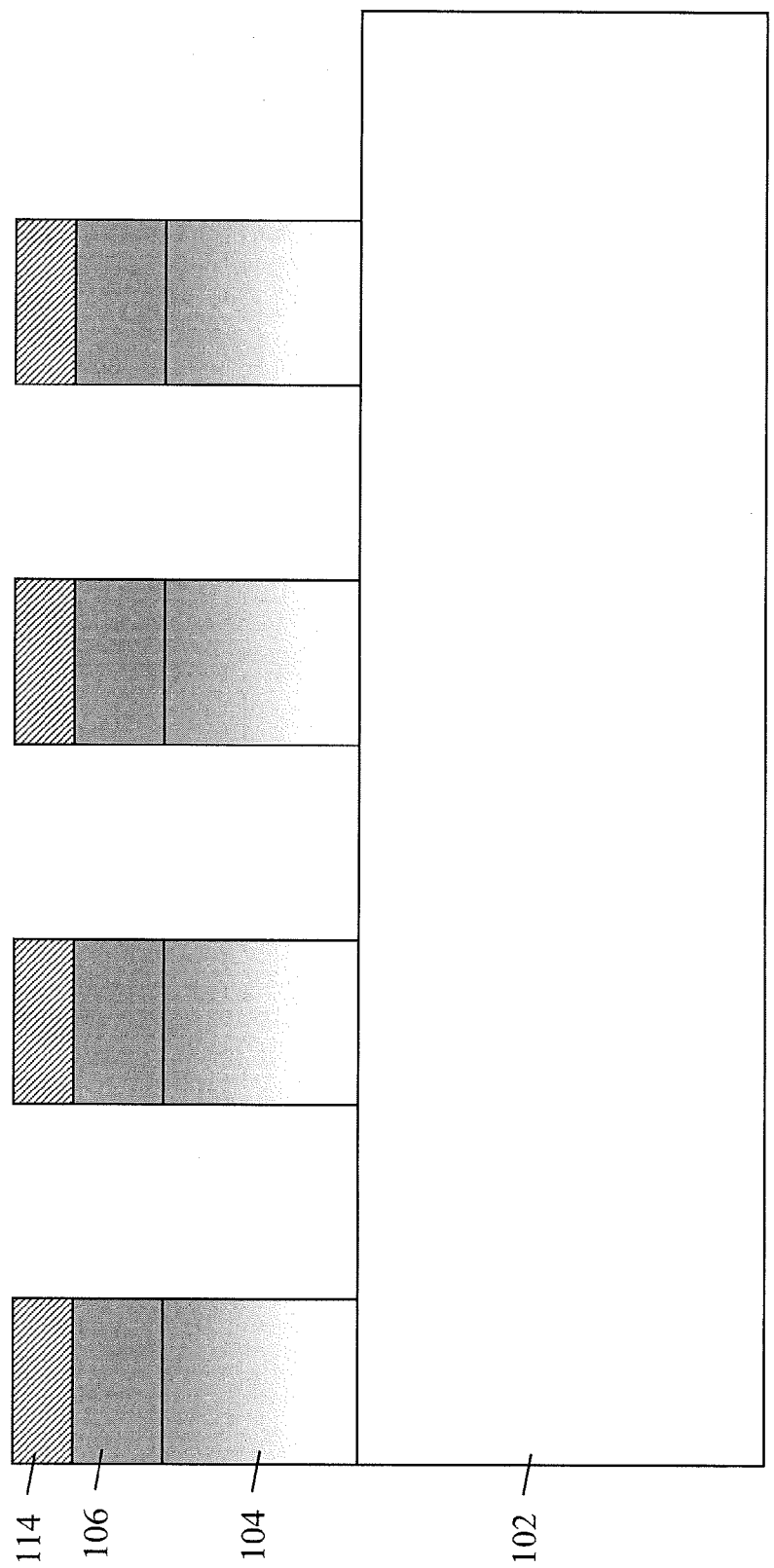

Referring now to FIG. 2, a hardmask layer 114 is formed over the relaxed SiGe layer 106. A lithography operation is then used to pattern the hardmask layer 114 so that selective portions of the graded SiGe buffer layer 104 and relaxed SiGe layer 106 are removed from the silicon layer. As will be seen in later figures, the removed portions of the graded SiGe buffer layer 104 and relaxed SiGe layer 106 will correspond to relaxed silicon regions in the final SOI substrate, and the remaining portions of the graded SiGe buffer layer 106 and relaxed SiGe layer 104 will correspond to tensile strained silicon regions in the final SOI substrate. The hardmask layer 114 may be any suitable hardmask material known in the art, such as a nitride or oxide, for example.

Figure 3:
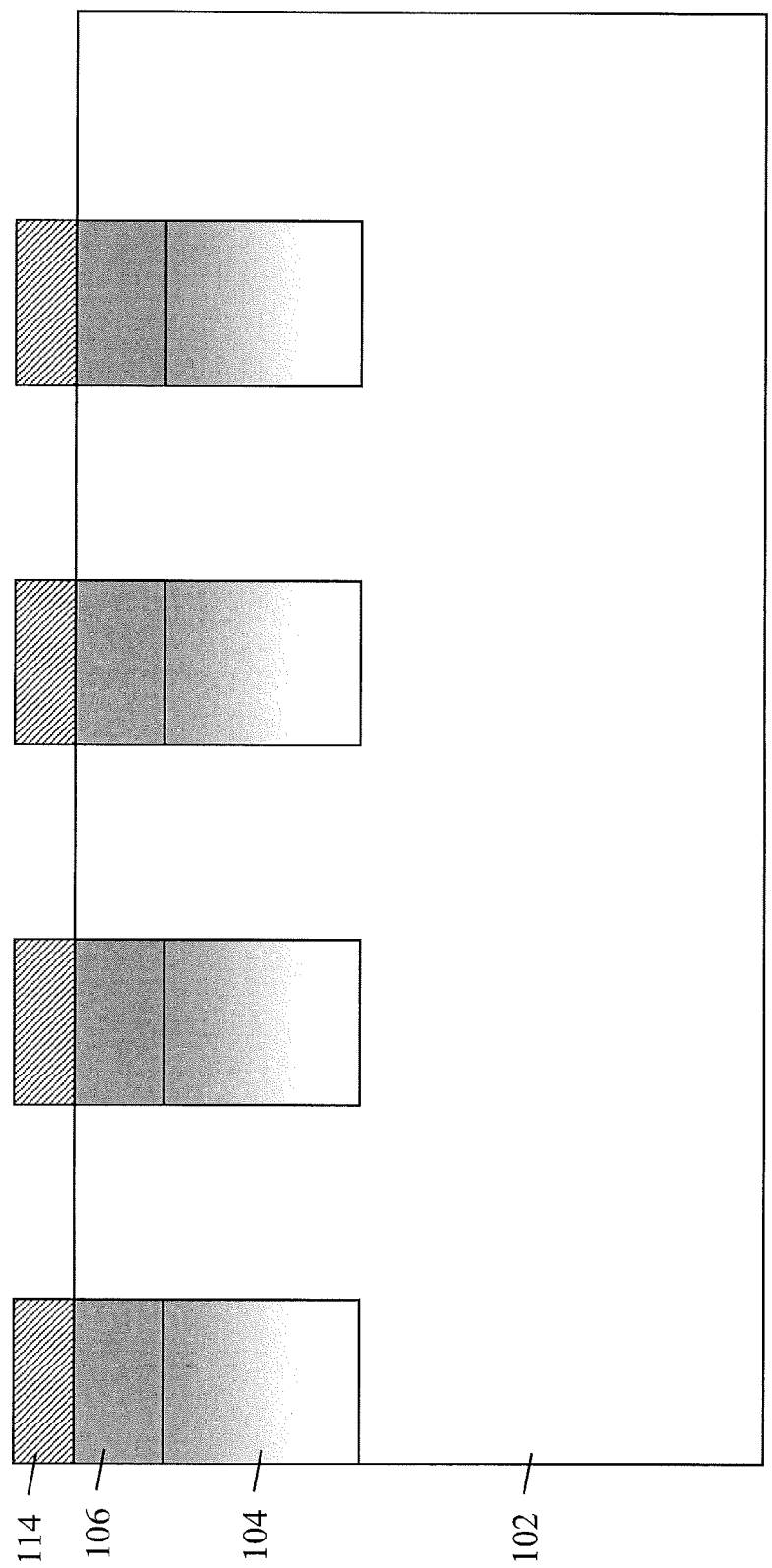
Figure 4:
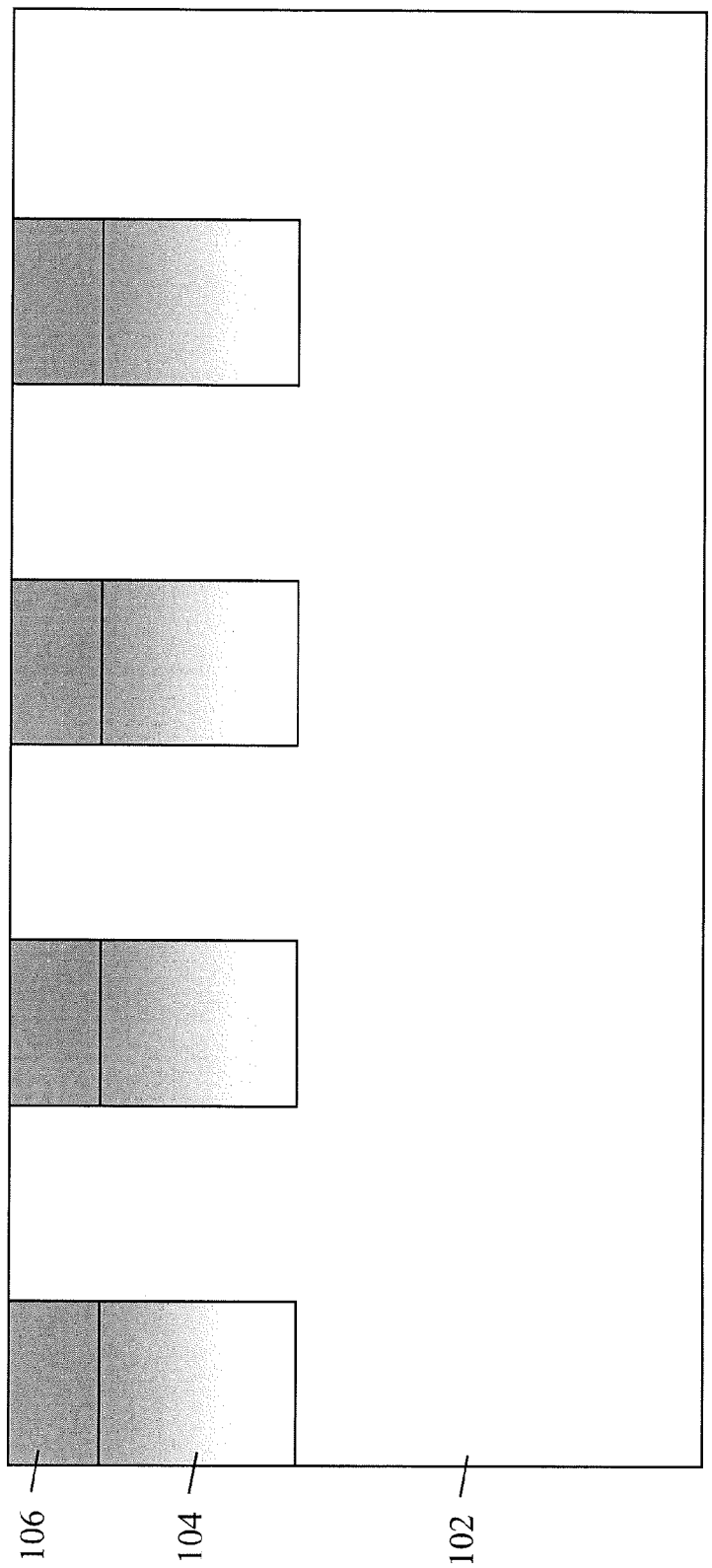

At this point in the process flow (although not shown in the figures), a spacer (e.g., SiN or $SiO_2$) may be formed over the side wall regions of the relaxed SiGe so that no epitaxial silicon is formed on the side wall of the relaxed SiGe. Alternatively, an oxide interfacial layer can be formed on the side wall so that epitaxy takes place from the bottom silicon only. As then shown in FIG. 3, a silicon epitaxial growth process is used to grown relaxed silicon 102 in regions where the graded and relaxed SiGe was removed. Notably, the patterned hardmask layer 114 remains in place during the silicon regrowth process, preventing growth of silicon on the top surface of the relaxed SiGe layer 106 while the spacer prevents silicon from growing on the side wall of the relaxed SiGe. FIG. 4 illustrates the removal of the hardmask layer 114, which may be followed by a polish operation. As can be seen, the top surface of the donor wafer at this point has regions of relaxed SiGe and regions of (relaxed) Si.

Figure 5:
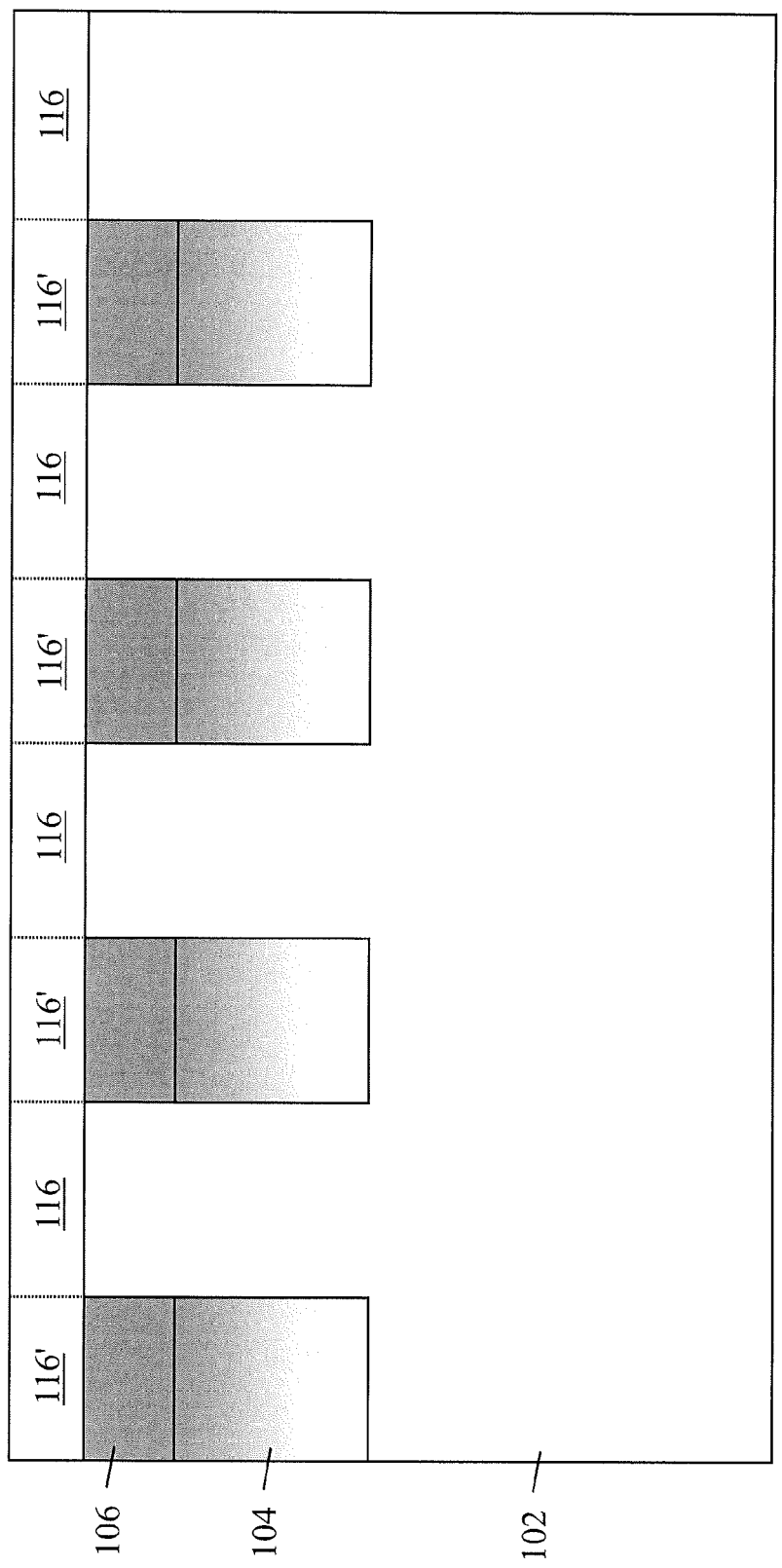

Referring to FIG. 5, a silicon device layer (116/116') is grown on the donor wafer, such that the silicon is tensile strained on portions of the donor wafer corresponding to relaxed SiGe 106 and relaxed on portions of the donor wafer corresponding to silicon 102. Here, the tensile strained portions of the silicon device layer are designated 116', while the relaxed portions of the silicon device layer are designated 116. An exemplary thickness for the silicon device layer (116/116') may be about 25-100 nm. Following oxidation of the donor wafer to form a thin oxide layer (not shown), the silicon device layer (116/116') is now ready to be transferred from the donor wafer to a handle wafer.

Figure 6:
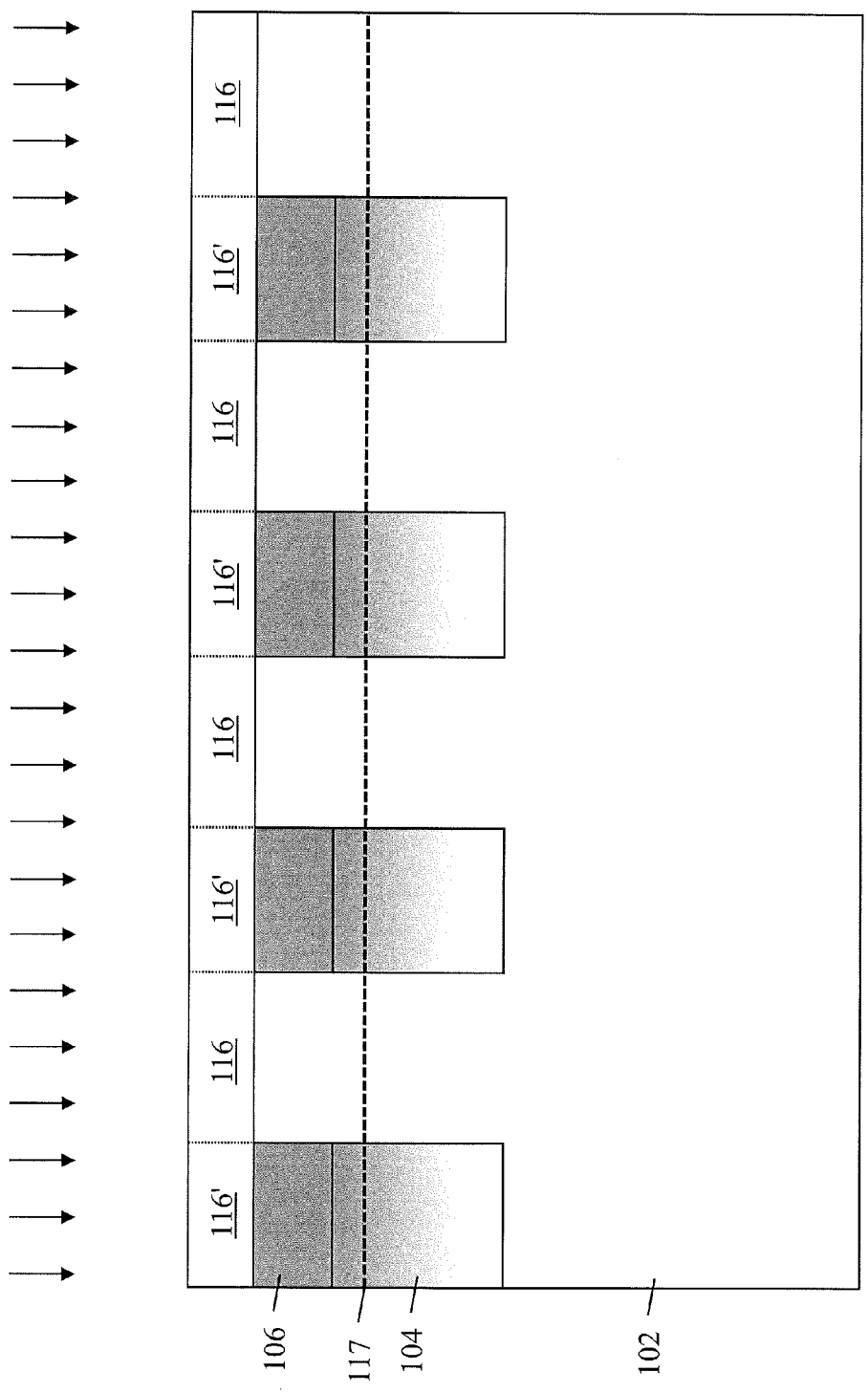
Figure 7:
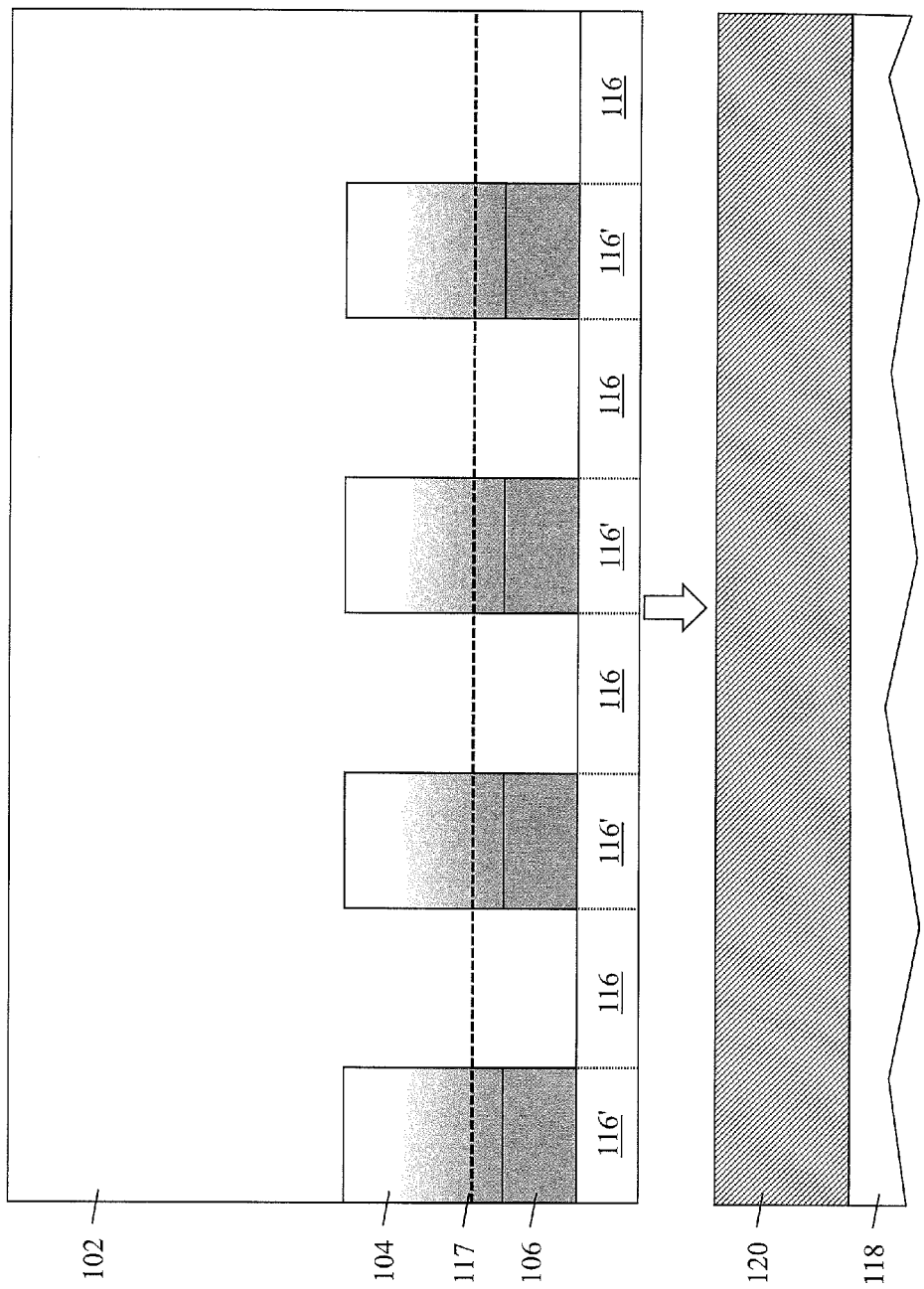

FIG. 6 illustrates the implantation of a hydrogen species into the SiGe/Si portion of the donor wafer in accordance with a smart cut process. As is known in the art, the ion implantation results in a weakened or "bubble" layer 117 below the bottom of the silicon device layer (116/116'). Although the bubble layer 117 is shown at a level roughly corresponding to the graded SiGe layer 104, it will be understood that this layer 117 (which represents the mean ion penetration depth) can be formed at a level above or below that shown in FIG. 6, so long as it is below the silicon device layer (116/116'). Then, as shown in FIG. 7, the donor wafer is positioned so as to be bonded to a handle wafer that includes a bulk semiconductor layer 118 (e.g., silicon) and an oxide layer 120 that may be on the order of about 50 nm in thickness.

Figure 8:
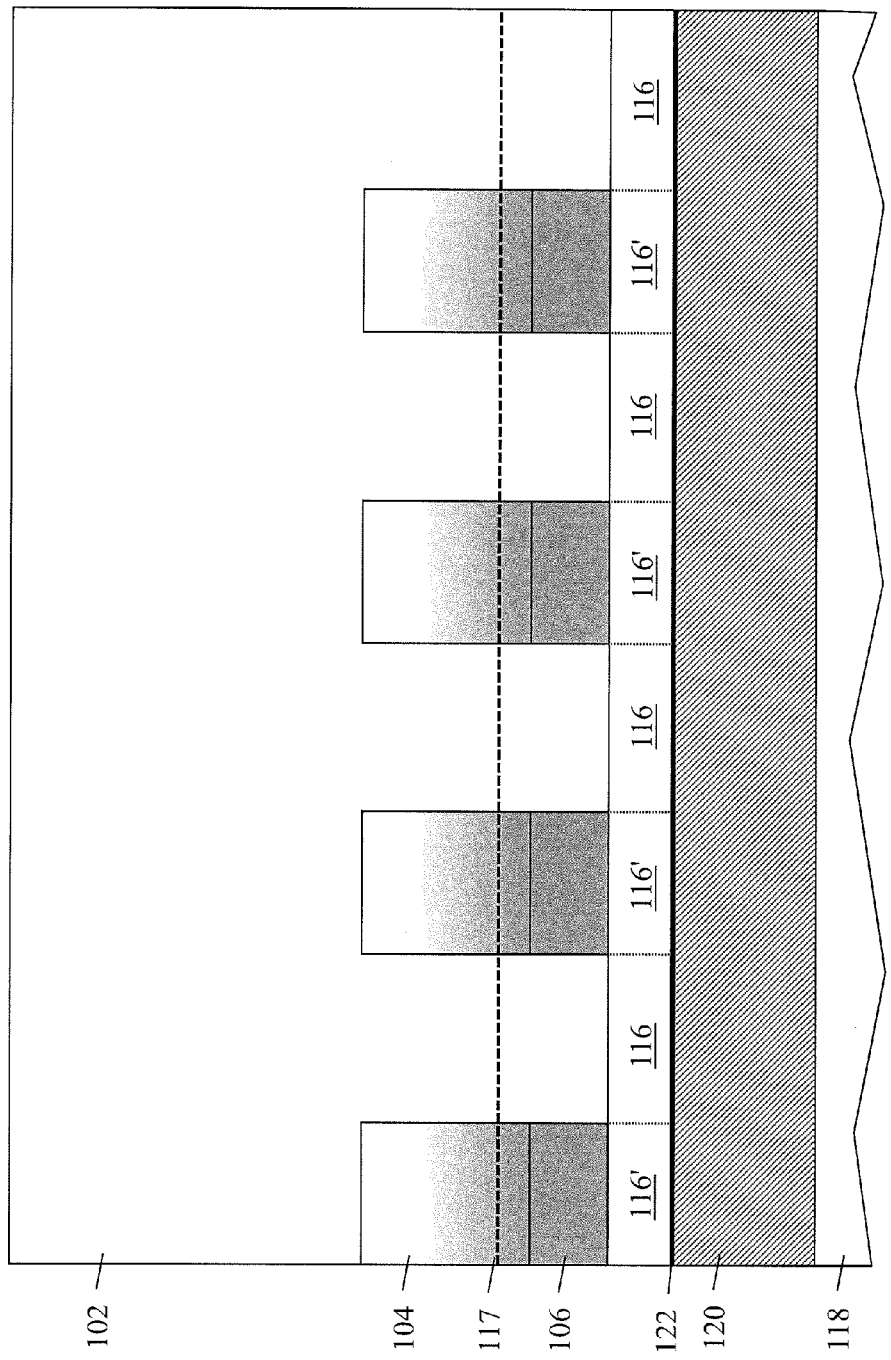
Figure 9:
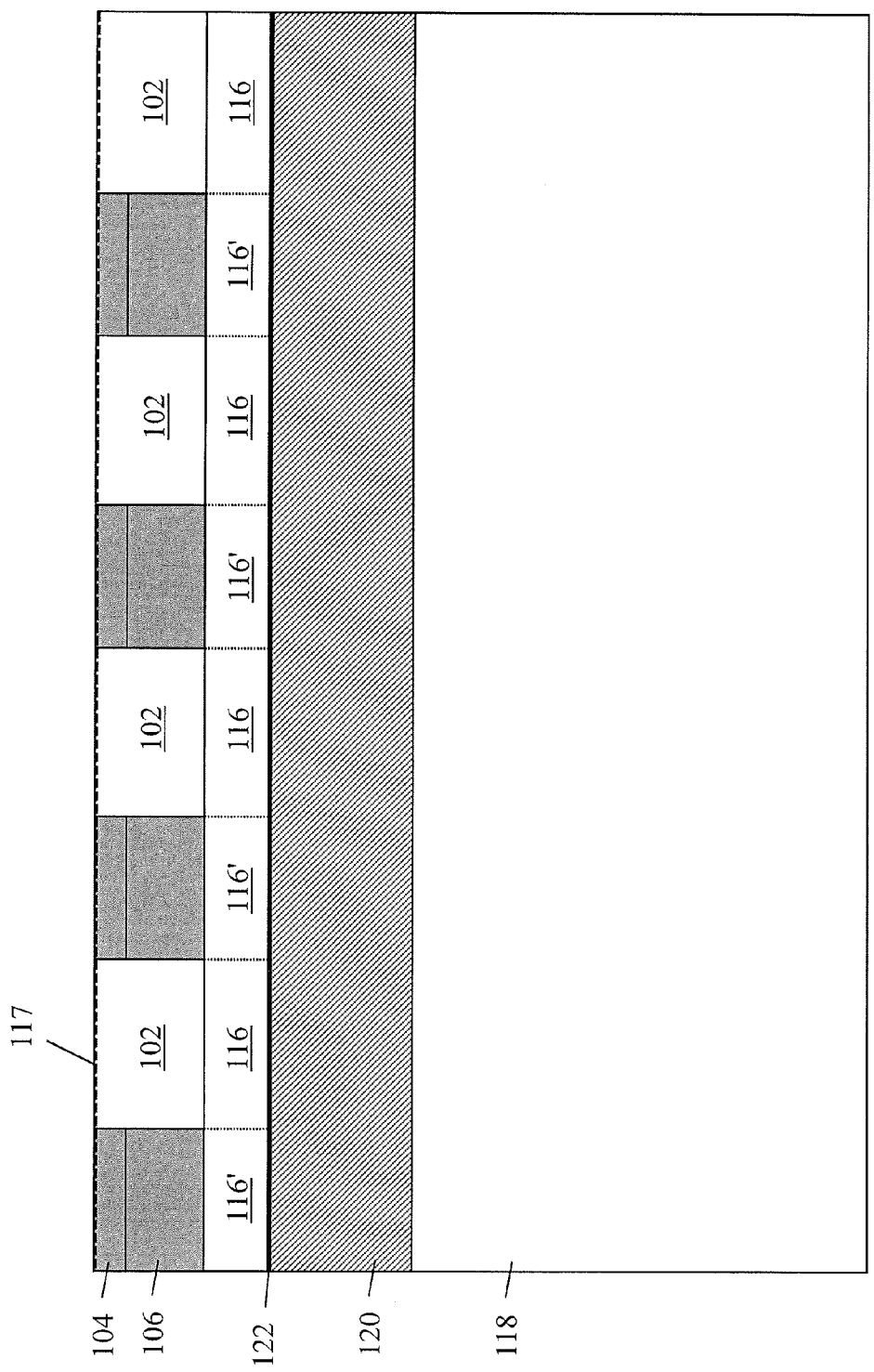

FIG. 8 illustrates the bonding of the handle wafer to the donor wafer at an oxide-to-oxide bonding interface 122. Once bonded, the majority of the donor wafer may be separated from the structure by cleaving at the bubble layer 117. The donor wafer may then be recycled as needed. Proceeding to FIG. 9, the new handle wafer with the transferred the silicon device layer (116/116') bonded thereto is illustrated, as well as remaining portions of the donor wafer. These remaining portions of the donor wafer (i.e., 102/104/106) may then be removed by a suitable planarizing operation (e.g., wet etching, polishing, etc.) to form the novel SOI substrate 130 having regions of relaxed silicon 116 and regions of tensile strained silicon 116'. Notably, regions 116' remain tensile strained notwithstanding the removal of the relaxed SiGe remnants of the donor wafer, due to the strength of the bonding interface 122.

Figure 10:
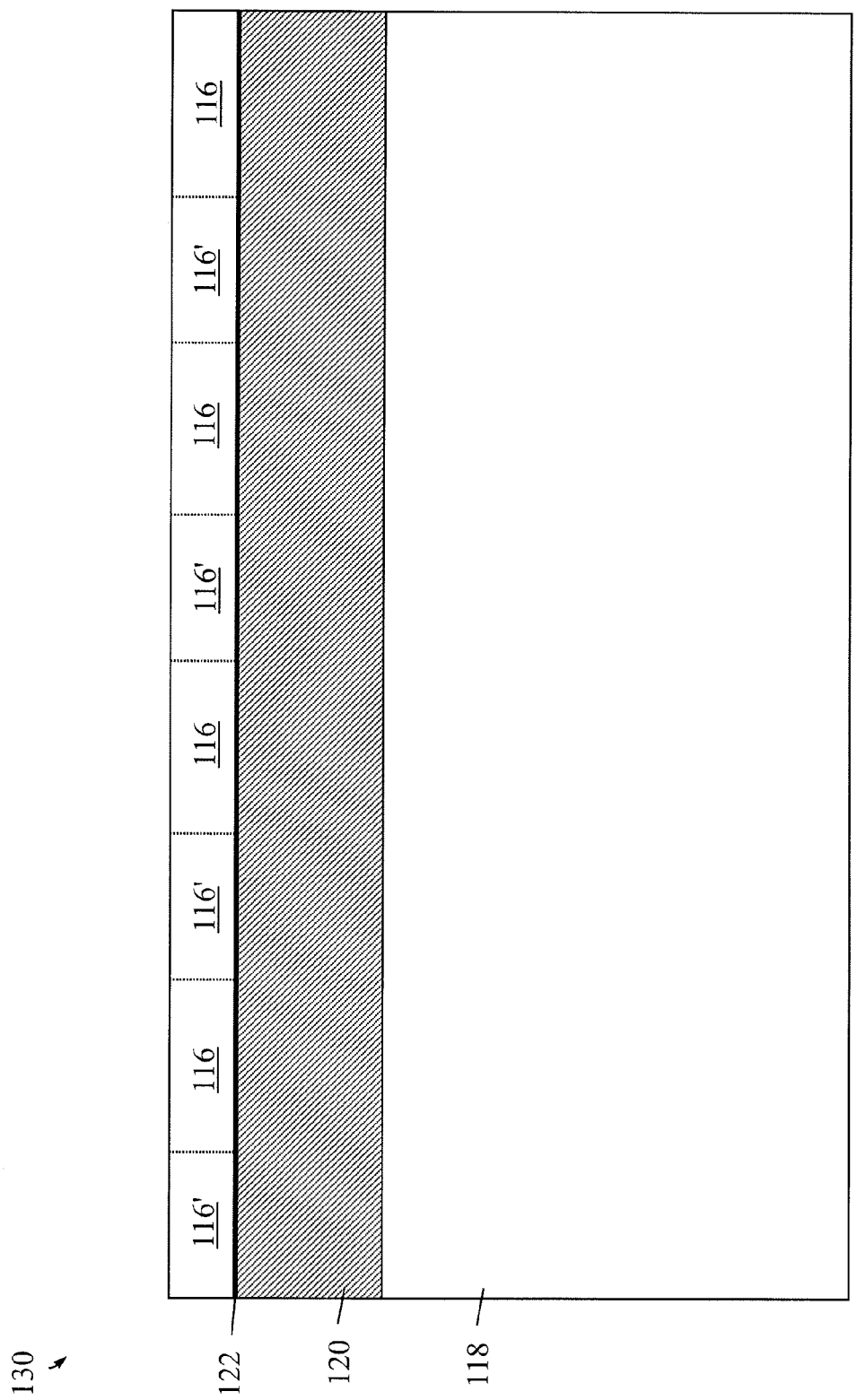

As opposed to an SOI substrate having a completely relaxed SOI active device layer (with no NFET carrier mobility enhancement), or an SOI substrate having a completely tensile strained SOI active device layer (with PFET carrier mobility degradation), the novel SOI substrate 130 of FIG. 10 provides tensile strained SOI active device regions 116' for NFET formation, and relaxed SOI active device regions 116 for PFET formation.

Figure 11:
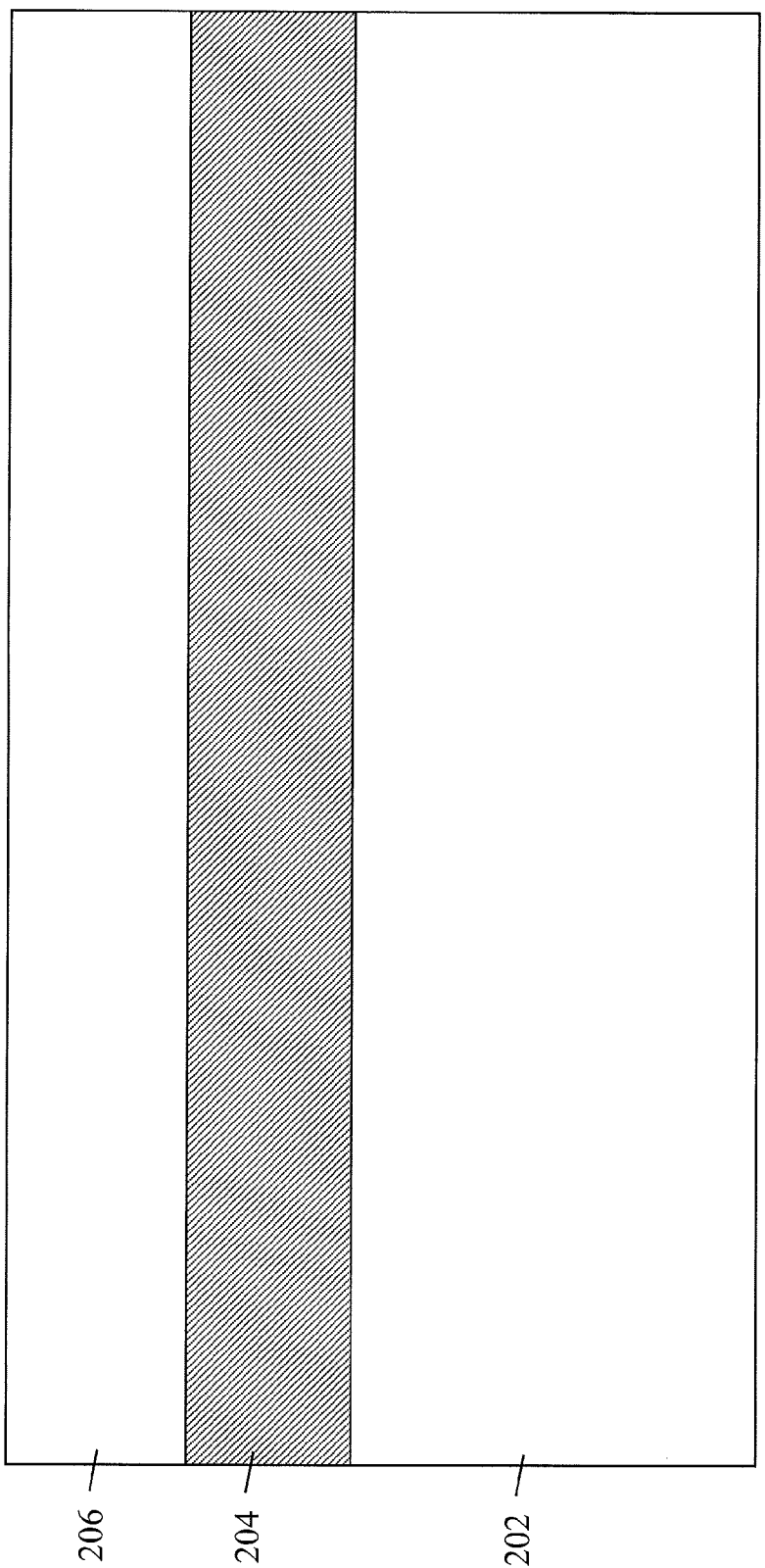

Referring generally now to FIGS. 11 through 16, a series of cross sectional views of a method of forming SOI substrates having selected strained and relaxed device regions is illustrated, in accordance with another exemplary embodiment. In FIG. 11, an SOI substrate is used as a starting material for a donor wafer, which includes a bulk layer 202, a buried oxide (BOX) layer 204, and an SOI layer 206 on the BOX layer 204.

Figure 12:
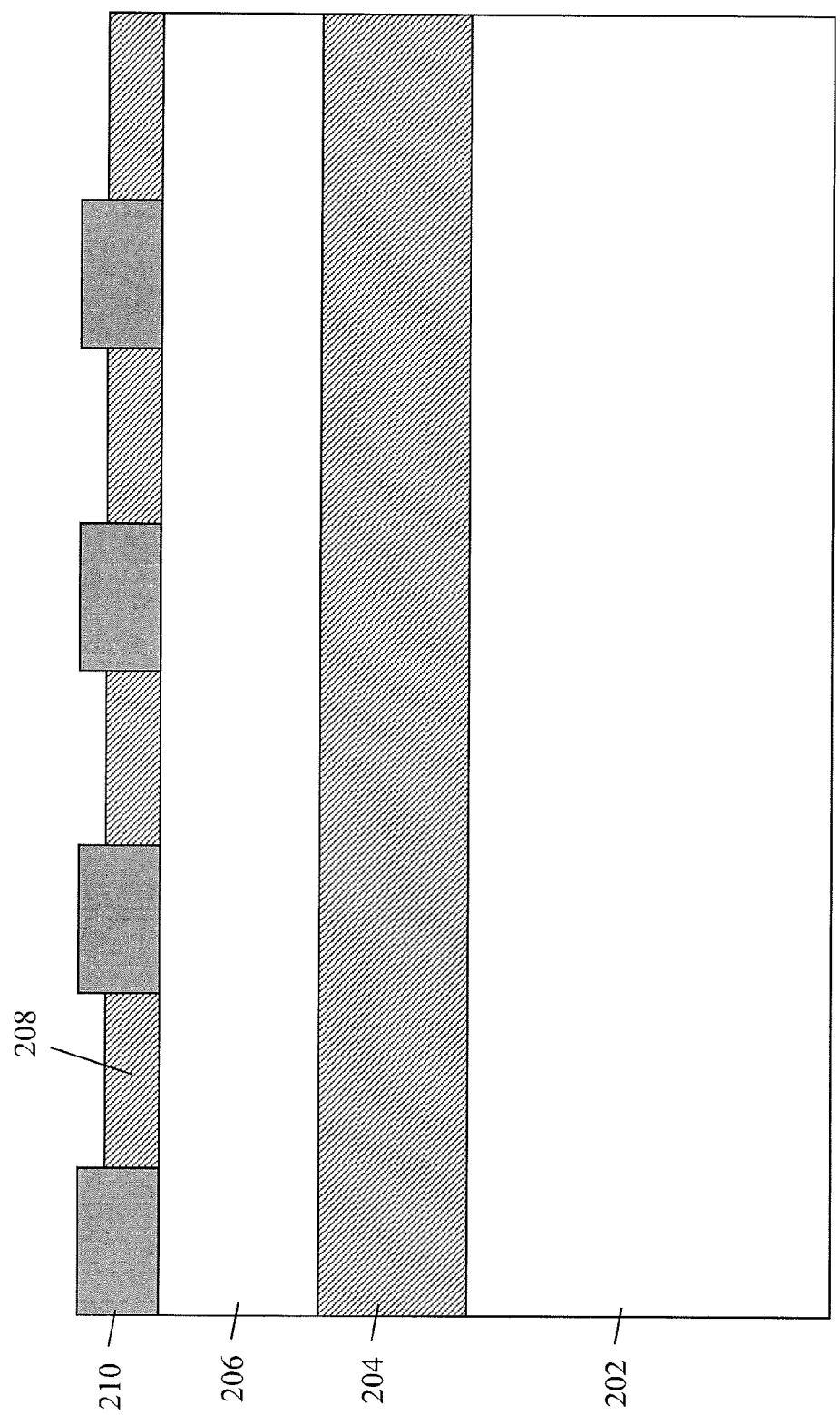

As then shown in FIG. 12, a hardmask layer 208 is patterned to protect regions of the SOI layer 206 where relaxed silicon regions are to be formed. Again, the hardmask layer 208 may be any suitable hardmask material known in the art, such as a nitride or oxide. By way of comparison to the first embodiment, it will be noted that the hardmask layer 208 has the opposite pattern with respect to FIG. 2 of the first embodiment, in which the hardmask layer 114 protects regions where tensile strained silicon regions are to be formed. In any case, FIG. 12 further illustrates SiGe regions 210 grown on exposed regions of the SOI layer 206. As initially formed, the SiGe regions 210 are compressively strained due to lattice matching to the silicon in the SOI layer 206.

Figure 13:
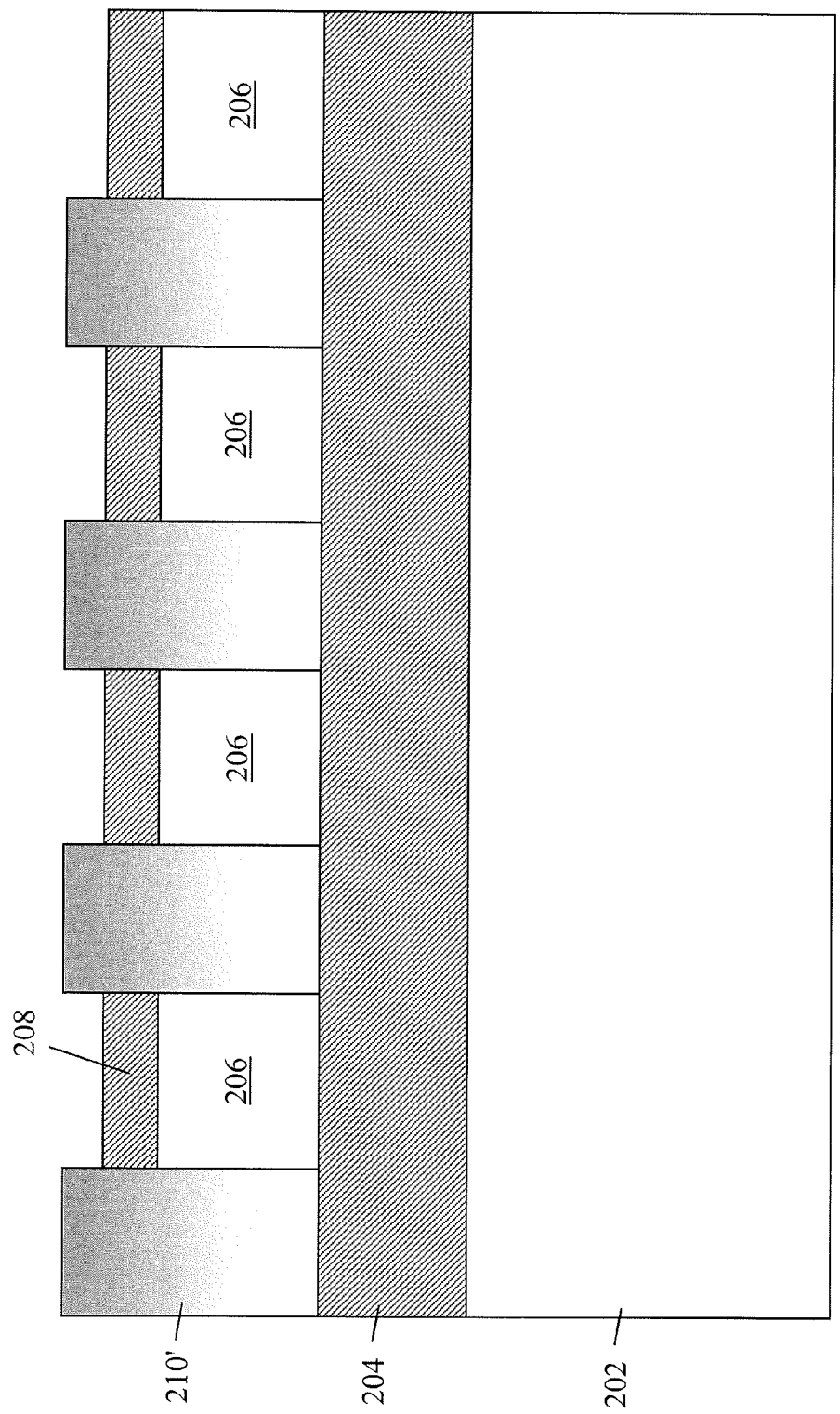
Figure 14:
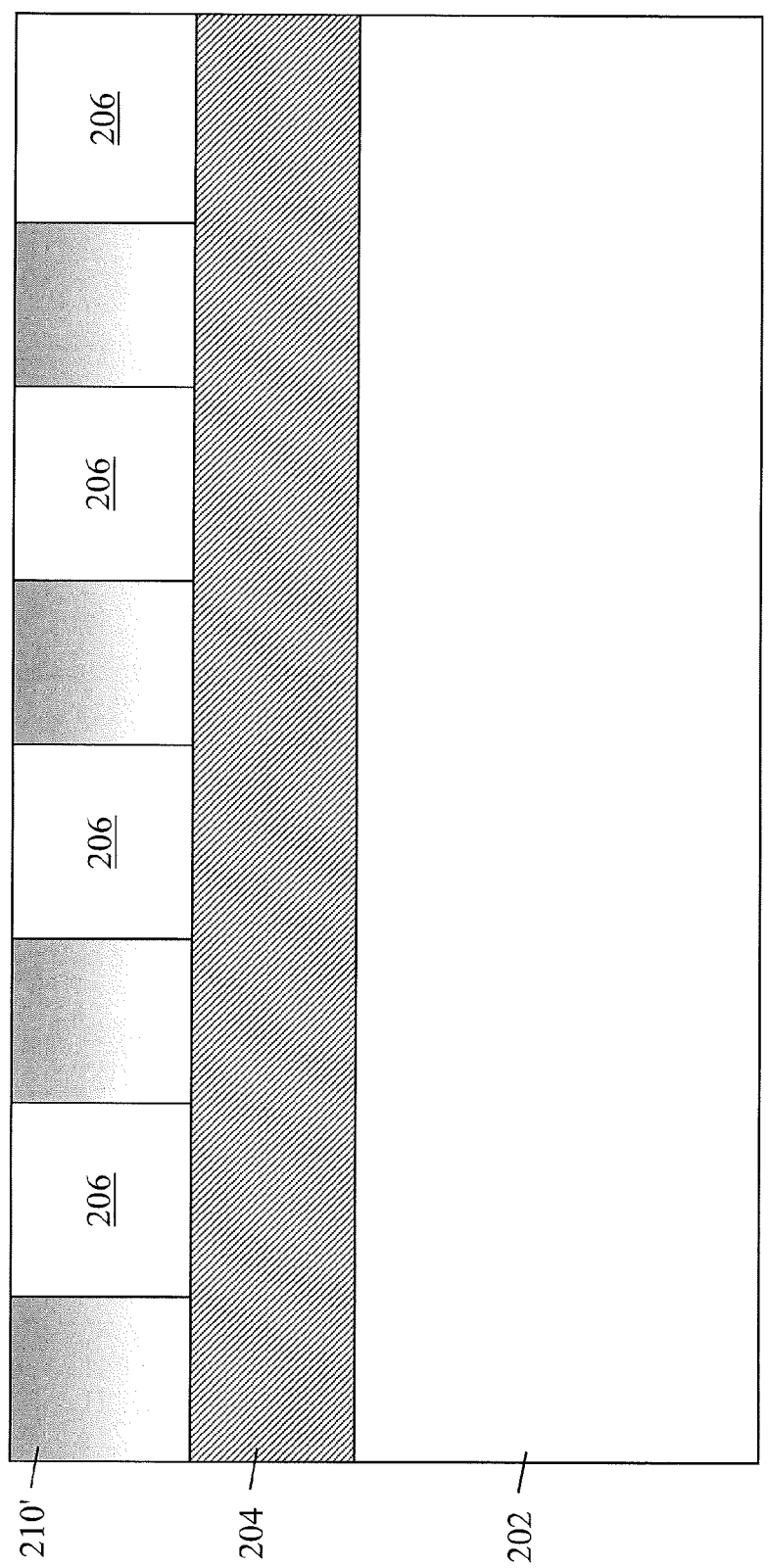

Proceeding to FIG. 13, a thermal process is used to relax the compressively strained SiGe regions 210 by diffusion of germanium atoms, resulting in relaxed SiGe islands 210' on the BOX layer 204. Then, as shown in FIG. 14, the hardmask layer 208 is removed. This may be followed by a planarizing operation such as chemical mechanical polishing (CMP) to remove topography, leaving regions of relaxed SiGe 210' and relaxed silicon 206 on the BOX layer 204.

Figure 15:
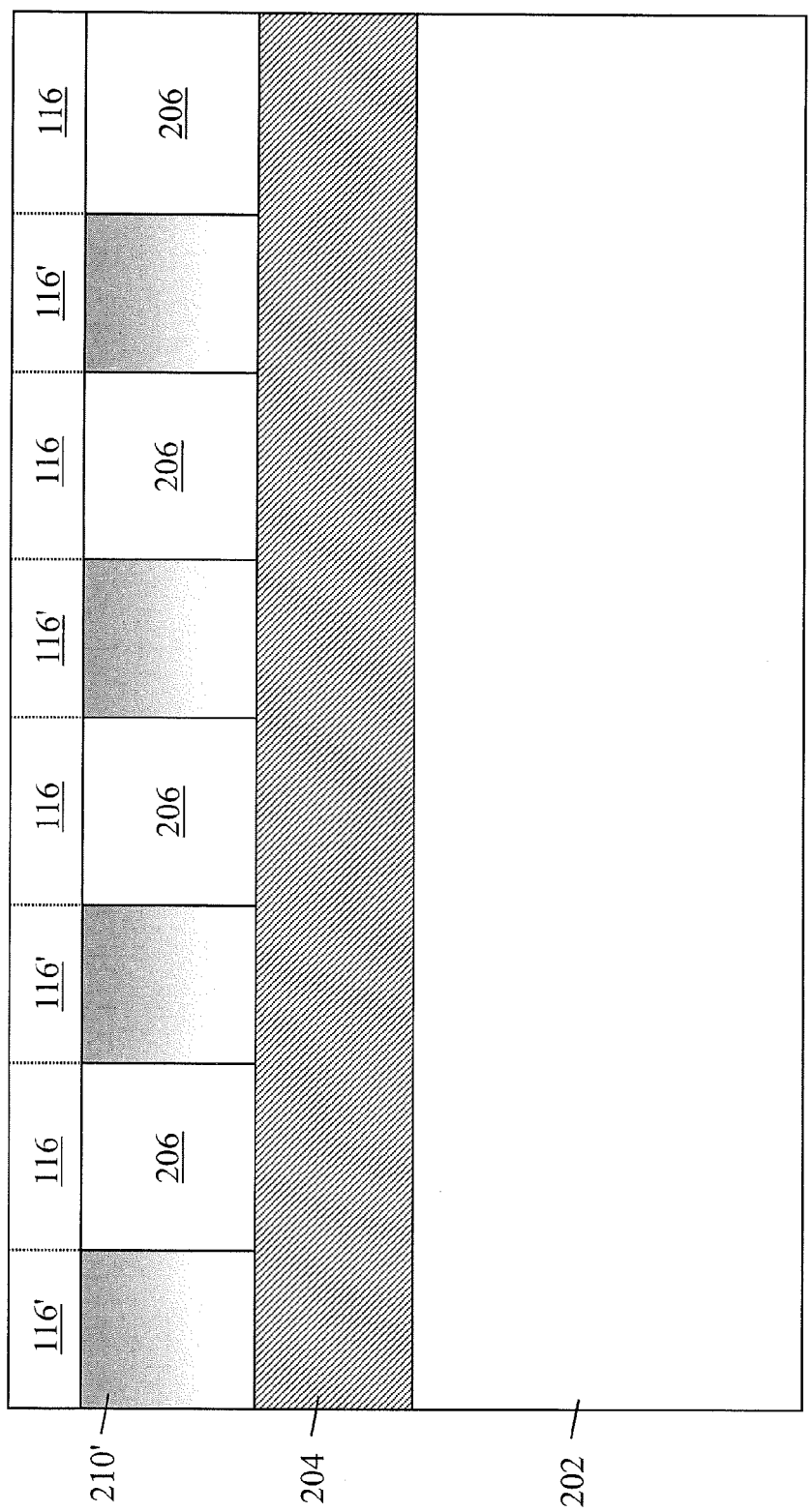
Figure 16:
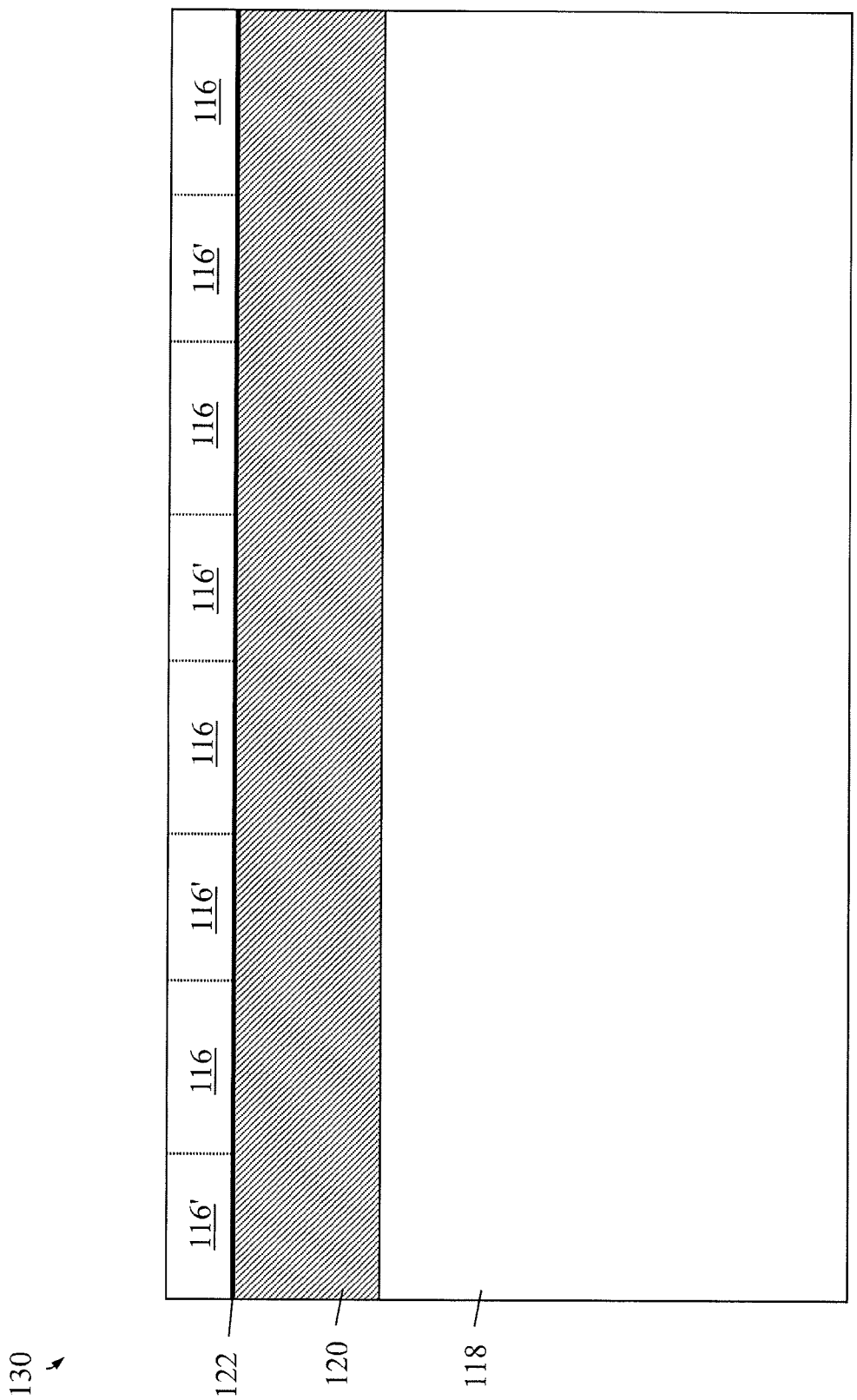

FIG. 15 illustrates the growth of a silicon device layer on the donor wafer. Similar to the first embodiment, the silicon is tensile strained silicon 116' portions of the donor wafer corresponding to relaxed SiGe 210' and relaxed silicon 116 on portions of the donor wafer corresponding to relaxed silicon 206. Upon formation of the silicon device layer 116/116', the layer is now ready for transfer from the donor wafer to a handle wafer. Reference may be made once again to FIGS. 6 through 9 for details on a layer transfer process, such as smart cut. This results in the SOI substrate of FIG. 16, where the silicon device layer 116/116' is transferred from the donor wafer to the handle wafer, including a bulk semiconductor layer 118, oxide layer 120 and bonding interface 122.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming a semiconductor device substrate, the method comprising: epitaxially growing a graded silicon germanium (SiGe) buffer layer on a donor substrate and a relaxed SiGe layer on the graded SiGe buffer layer; forming a patterned hardmask on the relaxed SiGe layer; removing selective portions of the graded SiGe buffer layer and the relaxed SiGe layer;
   epitaxially growing a plurality of regions of additional relaxed silicon layer on the donor substrate, corresponding to the removed selective portions of the graded SiGe buffer layer and the relaxed SiGe layer; removing the hardmask layer to form a donor wafer comprising a plurality of regions of relaxed SiGe layer, and the plurality of regions of additional relaxed silicon layer; epitaxially growing a silicon device layer on the surface of the donor wafer, wherein the silicon device layer comprises a plurality of regions of tensile strained silicon layer on the plurality of regions of relaxed SiGe layer of the donor wafer, and a plurality of regions of relaxed silicon layer on the plurality of regions of additional relaxed silicon layer of the donor wafer; and transferring the silicon device layer from the donor wafer to a handle wafer comprising a bulk substrate and an insulator layer, so as to form a silicon-on-insulator (SOI) substrate with the silicon device layer maintaining the plurality of regions of tensile strained silicon and the plurality of regions of relaxed silicon.

2. The method of claim 1, wherein forming the donor wafer further comprises:
   forming a spacer over side walls of regions corresponding to the removed selective portions of the graded SiGe buffer layer and the relaxed SiGe layer, wherein the spacer comprises SiN and SiO2.

3. The method of claim 2, wherein epitaxially growing relaxed SiGe layer comprises growing the relaxed SiGe layer to a thickness such that the graded SiGe buffer layer transitions from initially compressively strained to relaxed.

4. The method of claim 3, wherein the thickness of the relaxed SiGe layer is about 1-4 microns (μm).

5. The method of claim 1, wherein epitaxially growing a graded SiGe buffer layer comprises: growing the graded SiGe buffer layer to a thickness such that the graded SiGe buffer layer is initially compressively strained, wherein the thickness of the graded SiGe buffer layer is about 200-600 nanometers (nm); and implanting a defect layer within the graded SiGe buffer layer so as to relax the upper portion thereof.

6. The method of claim 1, wherein transferring the silicon device layer from the donor wafer to the handle wafer further comprises:
- performing a hydrogen species implantation process so as to create a bubble layer below a bottom surface of the silicon device layer;
- oxidizing a top surface of the silicon device layer;
- bonding the oxidized top surface of the silicon device layer to the insulator layer of the handle wafer; and
- cleaving the donor wafer from the handle wafer, at the bubble layer.

7. The method of claim 6, further comprising planarizing the handle wafer so as to remove remaining portions of the donor wafer from the handle wafer, and wherein an oxide-to-oxide bonding interface maintains regions of tensile strained silicon within the silicon device layer.

* * * * *